United States Patent [19]

El-Hamamsy

[11] Patent Number: 5,113,171
[45] Date of Patent: May 12, 1992

[54] HIGH-FREQUENCY CURRENT-VIEWING RESISTOR

[75] Inventor: Sayed-Amr A. El-Hamamsy, Schenectady, N.Y.

[73] Assignee: General Electric Company, Schenectady, N.Y.

[21] Appl. No.: 632,213

[22] Filed: Dec. 21, 1990

[51] Int. Cl.⁵ .............................................. H01C 3/02
[52] U.S. Cl. .................................................... 338/61
[58] Field of Search .................. 338/61, 216, 49, 120; 333/22 R, 81 A

[56] References Cited

U.S. PATENT DOCUMENTS 2,931,000  3/1960  Gordon .................................. 338/61

Primary Examiner—Marvin M. Lateef
Attorney, Agent, or Firm—Jill M. Breedlove; James C. Davis, Jr.; Marvin Snyder

[57] ABSTRACT

A current-viewing resistor for accurately measuring high-frequency currents, e.g. at radio frequencies, includes a first resistance connected in series with a first inductance, the series combination being connected in parallel with a series combination of a second resistance and a second inductance. The second resistance is relatively large as compared with the first resistance, and the second inductance is relatively large as compared with the first inductance. The ratio of the first resistance to the first inductance is substantially equal to the ratio of the second resistance to the second inductance. As a result, the voltage measured across the second resistance is substantially equal to the voltage across the first resistance, and the current through the first resistance is substantially equal to the current to be measured.

1 Claim, 1 Drawing Sheet

5,113,171

HIGH-FREQUENCY CURRENT-VIEWING RESISTOR

FIELD OF THE INVENTION

The present invention relates generally to current sensors and, more particularly, to a current-viewing resistor suitable for accurately measuring radio frequency (RF) currents.

BACKGROUND OF THE INVENTION

Current-viewing resistors for relatively low-frequency applications typically comprise a narrow portion of a conductor on a printed circuit board, which narrow portion has a predetermined length, width and thickness and, hence, a predetermined resistance. Voltage measurements across this narrow portion of the conductor result in accurate current measurements therethrough. At relatively low frequencies, the reactance of the inductance associated with the current-viewing resistor is typically negligible and does not interfere with the attainment of accurate current measurements. However, at higher frequencies, e.g. in the RF range, the reactance of the inductance of the current-viewing resistor substantially increases. As a result, the voltage across the current-viewing resistor is no longer in phase with or proportional to the current therethrough.

Current-viewing resistors which overcome the aforementioned problems at high frequencies are presently available. Such current-viewing resistors may take the form of, for example, flat resistors or coaxial resistors. Disadvantageously, these high-frequency current-viewing resistors are generally costly and are, therefore, not practical for widespread use in commercial applications. There is, however, a present need for accurate, practical, high-frequency current sensors. For example, in an electrodeless high intensity discharge (HID) lamp ballast, a closed-loop control system such as that described in commonly assigned, copending U.S. patent application of S.A. El-Hamamsy and J.C. Borowiec, Ser. No. 631,836 filed Dec. 21, 1990, which application is incorporated by reference herein, requires accurate current sensing of the RF ballast output load current in order to generate control signals for high-efficiency operation.

Furthermore, since a current-viewing resistor typically carries the full circuit current, another desirable feature of a current-viewing resistor is a sufficiently low resistance value so that the power loss therein is negligible, while still accommodating a sufficiently large voltage drop for useful detection.

OBJECTS OF THE INVENTION

Accordingly, an object of the present invention is to provide a new and improved current-viewing resistor.

Another object of the present invention is to provide a current-viewing resistor for accurately sensing high-frequency currents, which current-viewing resistor is simple in construction.

Still another object of the present invention is to provide a current-viewing resistor having a sufficiently low resistance so that the power loss therein is negligible, while still accommodating a sufficiently large voltage drop thereacross for useful detection.

Yet another of the present invention is to provide a current-viewing resistor suitable for sensing current in an RF ballast for an electrodeless HID lamp.

SUMMARY OF THE INVENTION

The foregoing and other objects of the present invention are achieved in a new and improved current-viewing resistor for accurately measuring currents, even at relatively high frequencies, e.g. RF frequencies. The current-viewing resistor of the present invention includes a first resistance coupled in series with a first inductance, wherein the first inductance comprises the parasitic inductance of the first resistance. A series combination of a second resistance and a second inductance is connected in parallel with the series combination of the first resistance and the first inductance. The second resistance is relatively large as compared with the first resistance, and the second inductance is relatively large as compared with the first inductance. Furthermore, the ratio of the first inductance to the first resistance is substantially equal to the ratio of the second inductance to the second resistance. As a result, the voltage measured across the second resistance is substantially equal to the voltage across the first resistance, and the current through the first resistance is substantially equal to the current to be measured. A current-viewing resistor of the present invention is suitable for measuring RF currents in an electrodeless HID lamp system.

BRIEF DESCRIPTION OF THE DRAWINGS

The features and advantages of the present invention will become apparent from the following detailed description of the invention when read with the accompanying drawings in which.

DETAILED DESCRIPTION OF THE INVENTION

Figure 1:
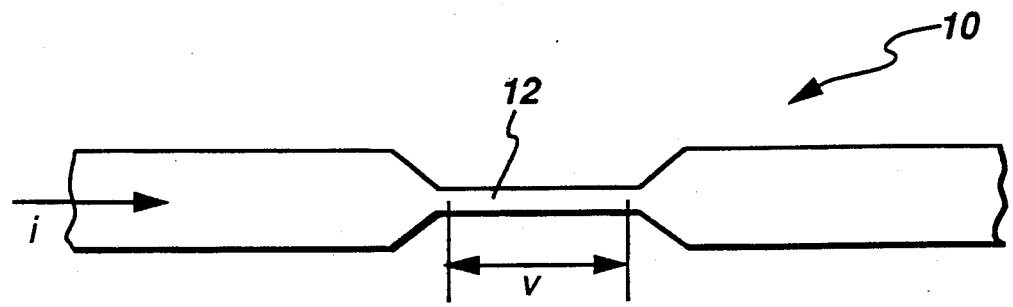
FIG. 1 illustrates a prior art current-viewing resistor of a type implemented on a printed circuit board.

FIG. 1 illustrates a conductor 10 of a type employed on a printed circuit board including a current-viewing resistor 12. Specifically, current-viewing resistor 12 comprises a narrow portion, having a predetermined length and width, of conductor 10. The resistance R of current-viewing resistor 12 is therefore determined according to the following well-known equation for resistance of a conductor:

$$R = \rho \frac{L}{A},$$

where $\rho$ is the resistivity of the conductor, L is the length of the conductor, and A is the cross sectional area of the conductor.

Figure 2:
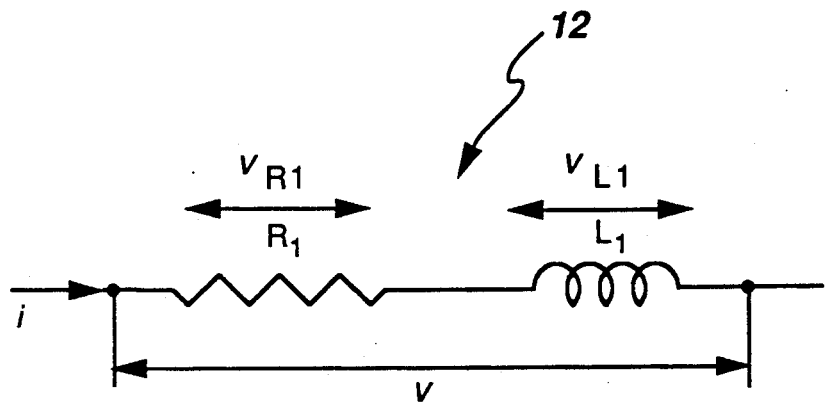
FIG. 2 is a schematic illustration of the current-viewing resistor of FIG. 1.

FIG. 2 is a schematic illustration of the current-viewing resistor 12 of FIG. 1. As shown, the current-viewing resistor comprises a resistance $R_1$ coupled in series with an inductance $L_1$, wherein the inductance $L_1$ comprises the parasitic inductance of the current-viewing resistor 12. The voltage v across current-viewing resistor 12 is given by the expression:

$$v = (j\omega L_1 + R_1)i,$$

where $\omega$ is the frequency in radians per second, $\omega L_1$ is the impedance of the inductance $L_1$, and i is the current through the conductor. At relatively low frequencies, the impedance $\omega L_1$ of the inductance is negligible as compared with that of the resistance $R_1$. Hence, by measuring the voltage across the current-viewing resistor 12, a reliable determination of the current i can be made. Disadvantageously, however, as frequency increases, the impedance $\omega L_1$ of the inductance $L_1$ increases, decreasing the accuracy of current measurements. Moreover, at RF, the voltage drop $v_{L1}$ across the inductance $L_1$ is typically greater than the voltage drop $v_{R1}$ across the resistance $R_1$.

Figure 3:
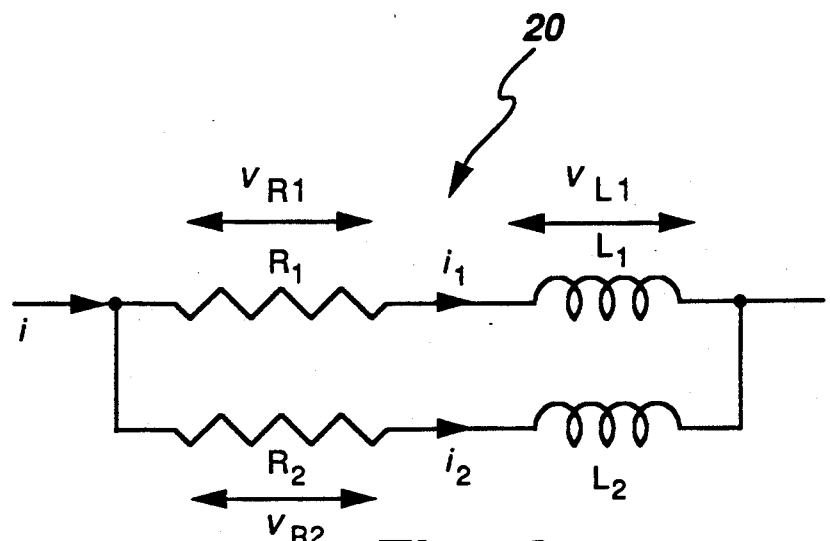
FIG. 3 is a schematic illustration of a current-viewing resistor of the present invention.

FIG. 3 illustrates a current-viewing resistor 20 in accordance with a preferred embodiment of the present invention wherein the series combination of resistance $R_1$ and inductance $L_1$ is connected in parallel with the series combination of a second resistance $R_2$ and a second inductance $L_2$. The second inductance $L_2$ does not include the parasitic inductance of the second resistance $R_2$, but comprises a lumped circuit component. In accordance with the present invention, resistance $R_2$ is substantially greater than resistance $R_1$, and inductance $L_2$ is substantially greater than inductance $L_1$. Advantageously, for $R_2 >> R_1$, the parasitic inductance of resistance $R_2$ is negligible. Furthermore, the ratio $\alpha$ of the first inductance $L_1$ to the first resistance $R_1$ is substantially equal to the ratio of the the second inductance $L_2$ to the second resistance $R_2$, as given by the following expression:

$$\alpha = \frac{L_1}{R_1} = \frac{L_2}{R_2}.$$

The voltage $v_{R2}$ across the second resistance $R_2$ is:

$$v_{R2} = i_2 R_2,$$

where $i_2$ is the current through the second resistance $R_2$. Moreover, the voltage V across the parallel combination can be expressed as:

$$v = i_1(R_1 + j\omega L_1) = i_2(R_2 + j\omega L_2).$$

Hence, the voltage $v_{R2}$ may be rewritten as;

$$v_{R2} = i_1 R_2 \frac{R_1 + j\omega L_1}{R_2 + j\omega L_2} = i_1 R_2 \frac{R_1}{R_2} \frac{1 + j\omega\alpha}{1 + j\omega\alpha} = i_1 R_1.$$

And, since $R_2 + j\omega L_2 > R_1 + j\omega L_1$, the current $i_1$ is substantially equal to the current i. Advantageously, therefore, the current $i_1$, and thus the current i, can be determined by measuring the voltage drop across resistance $R_2$. Moreover, since the larger resistance $R_2$ is shunted by the smaller resistance $R_1$, the use of the additional components ($R_2$ and $L_2$) does not add to the power loss of the current-viewing resistor.

While the preferred embodiments of the present invention have been shown and described herein, it will be obvious that such embodiments are provided by way of example only. Numerous variations, changes and substitutions will occur to those of skill in the art without departing from the invention herein. Accordingly, it is intended that the invention be limited only by the spirit and scope of the appended claims.

What is claimed is:

1. A current-viewing resistor, comprising:
 a first resistance having a parasitic inductance in series therewith; and
 a second resistance connected in series with a second inductance, the series combination of said second resistance and said second inductance being connected in parallel with the series combination of said first resistance and said parasitic inductance, said second resistance being relatively large as compared with said first resistance, and said second inductance being relatively large as compared with said parasitic inductance, the ratio of said parasitic inductance to said first resistance being substantially equal to the ratio of said second inductance to said second resistance;
 whereby the voltage across said second resistance is substantially equal to the voltage across said first resistance, and the current through said first resistance is substantially equal to the current through the parallel combination of said resistances and said inductances.

* * * * *